United States Patent

[11] 3,607,148

[72] Inventor Robert S. Foote
Phoenix, Ariz.
[21] Appl. No. 844,120
[22] Filed July 23, 1969
[45] Patented Sept. 21, 1971
[73] Assignee Motorola Inc.
Franklin Park, Ill.

[54] SOLDER PREFORMS ON A SEMICONDUCTOR WAFER
5 Claims, 3 Drawing Figs.

[52] U.S. Cl. .......... 29/195, 29/589, 317/234 G
[51] Int. Cl. .......... B32b 15/04
[50] Field of Search .......... 29/195, 580, 583, 589; 317/234

[56] References Cited

UNITED STATES PATENTS

| | | | |
|---|---|---|---|
| 3,025,439 | 3/1962 | Anderson | 317/240 |
| 3,242,391 | 3/1966 | Gorman | 317/234 |
| 3,361,592 | 1/1968 | Quetsch et al. | 117/212 |
| 3,386,894 | 6/1968 | Steppat | 204/15 |
| 3,387,360 | 6/1968 | Nakamura et al. | 29/579 |
| 3,495,322 | 2/1970 | Goldstein | 29/473.1 |

*Primary Examiner*—L. Dewayne Rutledge
*Assistant Examiner*—E. L. Weise
*Attorney*—Aichele & Rauner

ABSTRACT: A semiconductor wafer having a plurality of gold solder preforms attached to one surface thereof. The gold solder preforms are attached to an area of the wafer which is in registration with and wholly within the area defined by the scribe lines areas located on the opposite surface.

PATENTED SEP 21 1971

3,607,148

INVENTOR.
Robert S. Foote

BY Mueller, Aichele & Rauner

ATTY'S.

SOLDER PREFORMS ON A SEMICONDUCTOR WAFER

BACKGROUND OF THE INVENTION

This invention relates to a solder preform and more particularly to a semiconductor wafer having a plurality of gold solder performs thereon.

In the manufacture of planar-type semiconductor devices, several methods for forming ohmic contacts have evolved. One method is to evaporate the required contact metal, for example gold, through a metal foil mask that obscures the areas not to be covered. This method suffers from the disadvantage of poor resolution since it is difficult to avoid spreading of the contact metal under the mask.

A second method if referred to as the "etch-off technique" and involves first coating the entire semiconductor wafer with the contact metal and then etching off all but the contact area, the latter being masked by a photoresist during the etching step. The main disadvantage of this method is the tendency of the mask area to be undercut during the etching step. There are also problems of adhesion, namely, finding a suitable metal with sufficient conductivity and strong adhesion to the background material.

A third method widely used is to deposit a gold flash coating on the back side or collector region of a semiconductor wafer. This coating is very thin, that is, a few microns, so that it does not interfere with the scribe and break operation. The scribe and break operation involves scribing the front side of the semiconductor wafer with a grid of scribe marks and then inducing strains on the wafer thereby breaking the wafer along the scribe lines to form the individual die. In this method, the individual gold-plated semiconductor die is attached to a gold-plated header by placing the die on top of the header. This assembly is then raised to a sintering temperature for bonding the semiconductor die to a gold-plated header. This method involves the use of a substantial quantity of gold for plating the header with a layer of gold 60 to 120 microinches thick.

SUMMARY OF THE INVENTION

It is an object of this invention to provide a transistor die having a gold solder preform attached thereto. It is another object of this invention to provide a semiconductor wafer having a plurality of gold solder preforms attached thereto.

These and other objects are accomplished by a semiconductor wafer having a first surface with scribe line areas marked thereon and a second surface having a plurality of separate gold solder preforms positioned in areas wholly within and in registration with the areas inside of the scribe line areas. These gold preforms are separated from each other by an area in registration with the scribe line areas. This wafer structure permits the wafer to be broken along a line in the scribe line areas into individual dice, as is commonly done in the art, and which also have a gold solder preform attached thereto.

Other objects and advantages of this invention will be apparent from the following detailed description, reference being made to the accompanying drawings wherein a preferred embodiment of this invention is shown.

IN THE DRAWINGS

DESCRIPTION OF THE ILLUSTRATIVE EMBODIMENTS

Figure 1:
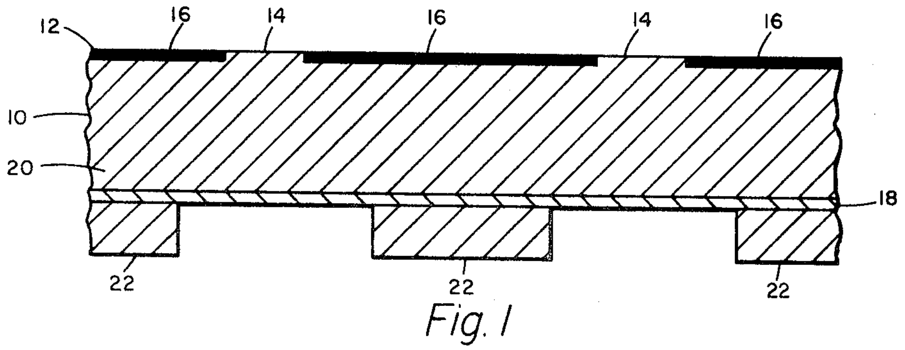
FIG. 1 is a side view and elevation of a semiconductor wafer in accordance with this invention.

As shown in FIG. 1 the wafer 10 has an upper surface 12. On the upper surface 12 are a plurality of scribe line areas 14 which separate the wafer 10 into a plurality of die 16. Typically, the scribe line areas 14 are about 3 mils wide; that is, the distance between two adjacent die 16 is about 3 mils (0.003 inches). Bonded to the lower surface 20 of the wafer is a thin coating of gold or gold flash 18.

In accordance with this invention, gold solder preforms are bonded to the gold flash 18. These gold preforms 22 are positioned in areas wholly within and in registration with the areas inside of the scribe line areas 14 on the upper surface. As such, the gold preforms 22 are directly below the die 16. The gold preforms 22 are separated from each other by an area in registration with the scribe line areas of the upper surface. When the scribe line areas on the upper surface separate adjacent die by a distance of about 3 mils, the gold preforms are separated by a preferred distance of 7 mils. Since the distance separating the gold preforms is larger than the scribe line areas separating the transistor die on the upper surface, the ability to register the gold preforms wholly within the scribe line areas of the upper surface is greatly enhanced. As a result thereof, substantially none of the gold preforms overlap or touch an area in registration with the scribe line areas.

These gold preforms are electroplated on the gold flash coated wafer surface 18 which has been previously masked with photoresist of the desired pattern. The pattern of the photoresist remaining on the gold flash coating 18 is made in registration with the scribe line areas of the upper surface by means of an alignment fixture.

The thickness of the gold solder preforms 22 is about 100 to 400 microinches (100 to $400\times10^{16}$ inches). The preferred thickness is about 200 to 250 microinches. Gold preform thicknesses above 400 microinches are more expensive and do not improve the quality of the bond. Preform thicknesses of the order of 100 to 150 microinches require extreme processing precautions to make a good bond.

Figure 2:
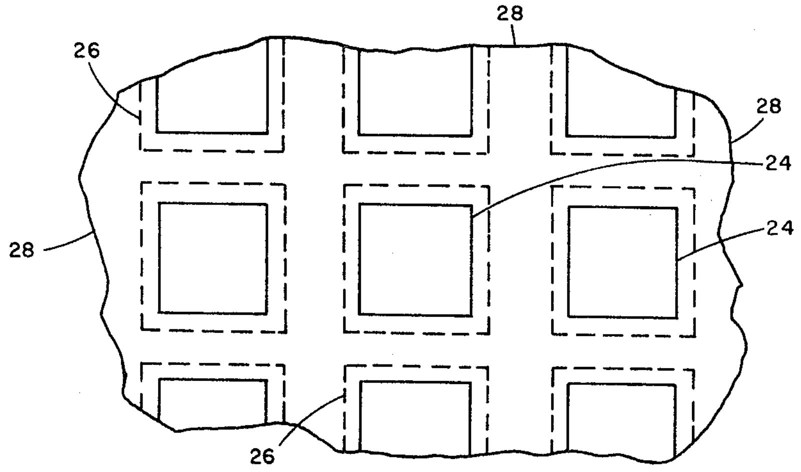
FIG. 2 is an end view of the semiconductor wafer.

The end view showing the relative registration of the solder preforms 24 to the projections of the die 26 and the scribe line areas 28 are shown in FIG. 2. The area occupied by the solder preform 24 is preferably less than the area of the die 26. The individual gold preforms 24 are separated from each other preferably by an area (7 mils wide) which is at least as large and preferably larger and in registration with the scribe line areas 28 (3 mils wide). This solder preform arrangement permits the semiconductor wafer to be broken into individual dice as is the practice in the art. The solder preforms must not cover the scribe mark areas since if the preforms do cover the scribe marks, the wafer cannot readily be broken into the individual die. In view of this, the registration of the solder preforms in an area wholly within the scribe marks is of extreme importance.

Figure 3:
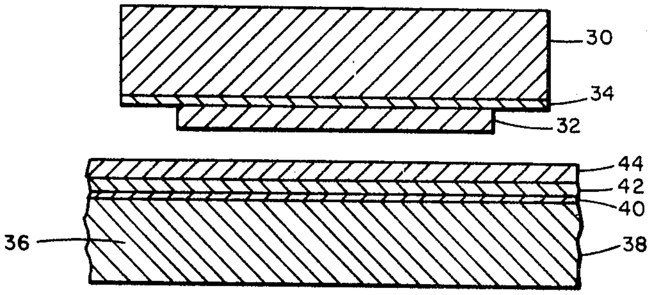
FIG. 3 is a side view of an individual semiconductor die having a gold solder preform thereon in position to be bonded to a header.

After the wafer 10 has been broken up into individual semiconductor die 30 having a gold solder preform 32 thereon and including a gold flash 34, the die 30 is attached to a substrate such as the plated header 36 shown in FIG. 3.

Any "JEDEC" (Joint Electronic Design Engineering Council) approved header would be suitable to be bonded with the semiconductor die of this invention having a gold solder preform thereon. The metal portion 38 is, for example, an iron-nickel-cobalt alloy having thermal expansion characteristics similar to glass used within the header.

On top of the metal portion 38 is a doped gold layer 40 having a thickness of about 0.5 to 2 microinches. Layer 40 is doped with 1 percent nickel or less. Layer 40 is sometimes referred to as an acid gold plate. On top of the doped gold layer 40 is a silver layer 42 which is about 3 to 10 microinches thick. On top of the silver layer 42 is a gold layer 44 which is about 12 to 50 microinches thick. This plated header system is described in detail in my copending application Ser. No. 843,717, filed concurrently with this application, now U.S. Pat. No. 3,593,412. This copending application is to be included herein by reference.

EXAMPLE 1

A silicon semiconductor wafer was processed in the conventional manner to obtain a plurality of die thereon separated by scribe line areas. The surface of the wafer having the die thereon was covered with a layer of photoresist, for example KMER, and baked. The second surface of the wafer, that is, the surface on the opposite side of the wafer from the die, had a thin gold flash layer applied thereto by conventional evaporation methods. The thickness of the gold flashing was about 0.5 to 3 microns. A layer of photoresist was then applied to the surface containing the gold flashing thereon. The wafer was baked to harden the photoresist to permit handling. The wafer was then placed in an alignment fixture and a mask was aligned in registration with the scribe line areas on the top surface. After the mask was positioned with the proper registration, the photoresist film was exposed to ultraviolet light. After developing, and removing the areas which have been relatively unexposed, there remains a photoresist pattern in registration with the scribe line pattern on the upper surface. The width of the scribe line areas on the upper surface was 0.003 inches while the width of the photoresist areas of the pattern on the lower surface was about 0.007 inches. This pattern was baked at an elevated temperature. The wafer was then placed in a gold electroplating bath and a layer of gold preforms were deposited on the gold flashing. The thickness of the gold preforms was about 200 microinches. After the plating of the gold preforms, the wafer was subjected to a cleaning step in which all of the photoresist material was removed from both of the wafer surfaces. The wafer was then scribed with a diamond point and a strain applied to the wafer to break up the wafer and separate the individual die.

An individual die having a solder preform thereon in accordance with this invention was then placed on top of a header. The header had a plurality of layers thereon including a gold flash layer directly on the header surface, a silver layer on top of the gold flash layer and a top layer of gold. This die was bonded to the header by placing the die on the header which was heated to a temperature exceeding 375° C.

While the invention has been described in terms of a preferred embodiment, the scope of the invention is defined in the following claims:

1. A semiconductor wafer comprising a first surface having scribe line areas thereon separating a plurality of semiconductor devices, a second surface, a gold flash coating bonded to said second surface, and a plurality of separate gold solder preforms bonded to said coating in areas wholly within and in registration with the areas inside of said scribe line areas on said first surface, said bold preforms being separated from each other by an area in registration with said scribe line areas.

2. A semiconductor wafer as described in claim 1 wherein the thickness of said gold preform is about 100 to 400 microinches thick.

3. A semiconductor wafer as described in claim 1 wherein the thickness of said gold preform is about 200 to 250 microinches thick.

4. A semiconductor wafer as described in claim 1 wherein said gold preforms are separated from each other by a distance of about 6 to 8 mils.

5. A semiconductor wafer as described in claim 1 wherein said adjacent gold preforms are separated from each other by a distance of about 7 mils.